United States Patent [19]

Matsunaga et al.

[11] Patent Number: 5,411,076
[45] Date of Patent: May 2, 1995

[54] SUBSTRATE COOLING DEVICE AND SUBSTRATE HEAT-TREATING APPARATUS

[75] Inventors: Minobu Matsunaga; Yasuhiro Mizohata, both of Kyoto, Japan

[73] Assignee: Dainippon Screen Mfg. Co., Ltd. Corp. of Japan, Kyoto, Japan

[21] Appl. No.: 192,563

[22] Filed: Feb. 7, 1994

[30] Foreign Application Priority Data

Feb. 12, 1993 [JP] Japan ................... 5-047528

[51] Int. Cl.⁶ .............................. F28F 7/00
[52] U.S. Cl. ................. 165/80.2; 29/25.01; 118/72 H
[58] Field of Search .......... 165/80.2, 80.4; 29/25.01; 118/724

[56] References Cited

U.S. PATENT DOCUMENTS 5,181,556 1/1993 Hughes .................. 165/80.2 X
5,194,401 3/1993 Adams et al. ............ 118/724 X

FOREIGN PATENT DOCUMENTS 63-46840 3/1988 Japan.
3-53832 5/1991 Japan.

*Primary Examiner*—John C. Fox
*Attorney, Agent, or Firm*—Ostrolenk, Faber, Gerb & Soffen

[57] ABSTRACT

A treating chamber includes a cooling plate assembly for supporting and cooling a substrate and an auxiliary cooling plate disposed on or adjacent a ceiling of the treating chamber. The auxiliary cooling plate reduces an atmospheric temperature in a space above the substrate supported on the cooling plate assembly to a target temperature to which the substrate is to be cooled by the cooling plate assembly. Consequently, the substrate having undergone a high temperature treatment is cooled quickly to the target temperature, and improved uniformity of temperature distribution is secured over a substrate surface after the cooling step.

8 Claims, 3 Drawing Sheets

SUBSTRATE COOLING DEVICE AND SUBSTRATE HEAT-TREATING APPARATUS

BACKGROUND OF THE INVENTION

1. Field of the Invention

The present invention relates to a substrate cooling device, and to a substrate heat-treating apparatus having the substrate cooling device. Specifically, such a substrate cooling device is used for cooling substrates, such as semiconductor wafers, glass substrates for photomasks, glass substrates for liquid crystal displays or substrates for optical disks, to a target temperature that is approximately room temperature, the substrate having been heated to a high temperature before and after a step of photoresist application or development during a photolithographic process.

2. Description of the Related Art

In this type of substrate heat-treating apparatus, the substrate cooling device includes a cooling plate for supporting a substrate. The cooling plate has a main cooler that is temperature-controlled with high precision to maintain the cooling plate at a constant temperature.

Such a substrate cooling device is required to cool the substrate to a desired temperature and to provide a uniform temperature distribution over a substrate surface. In practice, therefore, the configuration and control of the cooling plate mounted in a treating chamber are designed to maintain the cooling plate at a constant temperature and to secure a uniform temperature distribution throughout the cooling plate by means of the main cooler. Even with use of the cooling plate designed in this manner, there still arises a problem of impairing uniformity of temperature distribution over the surface of the substrate under treatment.

Inventors have conducted an intensive research on this problem and found that, when temperature adjacent the ceiling of the treating chamber that houses the cooling plate is higher than a target temperature, heat is inadvertently supplied by heat conduction and heat convention as well as heat radiation from the ceiling wall to the substrate that is cooled close to the target temperature by the cooling plate. This reheating effect has been the cause of inadequate uniformity of temperature distribution over the substrate surface occurring after the cooling step. Further, this type of substrate cooling device is often disposed under or laterally of a substrate heating device, and in many cases these cooling and heating devices are arranged close to each other to achieve a compact overall apparatus. The above drawback is found to occur particularly with such an arrangement.

In this case, even if the cooling plate is controlled to have a target temperature, the atmospheric temperature in the space of the treating chamber above the cooling plate remains higher than the target temperature. Consequently, a considerable time is required to cool the substrate to the target temperature.

SUMMARY OF THE INVENTION

A primary object of the present invention is to provide a construction for quickly cooling a substrate to a target temperature following high temperature treatment of the substrate, and securing improved uniformity of temperature distribution over a substrate surface after the cooling step.

Another object of the invention is to provide a construction for cooling a substrate to a target temperature at a still higher speed and securing improved uniformity of temperature distribution over a substrate surface with greater assurance after the cooling step.

Other objects of the invention will be apparent after studying the embodiment thereof described hereinbelow.

The above objects are fulfilled, according to the present invention, by a substrate cooling device comprising a treating chamber for receiving a substrate, a cooling plate assembly for supporting the substrate in the treating chamber, and a main cooler for cooling the substrate supported on the cooling plate assembly, wherein the treating chamber includes an auxiliary cooler disposed above the substrate supported on the cooling plate assembly for cooling the substrate.

With the substrate cooling device according to the present invention, the auxiliary cooler disposed in an upper region of the treating chamber mitigates the effect of heat radiating from a ceiling wall surface of the treating chamber opposed to the substrate supported on the cooling plate assembly. Consequently, the substrate is cooled quickly to a target temperature, with improved uniformity of temperature distribution secured over a substrate surface after the cooling step.

The auxiliary cooler may be adapted to maintain an atmospheric temperature in the treating chamber at the target temperature to which the substrate is to be cooled by the cooling plate assembly. This feature is effective, besides mitigating the effect of heat radiation from the ceiling wall of the treating chamber noted above, to check heat convection of air and the like in the treating chamber having thermal influences on the substrate. As a result, improved uniformity of temperature distribution is secured over the substrate surface with greater assurance. Moreover, the substrate is cooled to the target temperature at a still higher speed.

In a further aspect of the invention, the foregoing objects are fulfilled by a substrate heat-treating apparatus comprising a substrate heating device for heating a substrate; and a substrate cooling device for cooling the substrate, the substrate cooling device including a treating chamber for receiving a substrate, a cooling plate assembly for supporting the substrate in the treating chamber, and a main cooler for cooling the substrate supported on the cooling plate assembly; wherein the treating chamber includes an auxiliary cooler disposed above the substrate supported on the cooling plate assembly for cooling the substrate.

With the substrate heat-treating apparatus according to the present invention, even if heat from the substrate heating device raises the temperature of a ceiling wall and the like of the treating chamber of the substrate cooling device, the auxiliary cooler mitigates the effect of heat radiating from a ceiling wall surface of the treating chamber opposed to the substrate supported on the cooling plate assembly.

Thus, the substrate cooling device may be disposed adjacent, and above or below or laterally of, the substrate heating device without being restricted by a position of the latter. This enables the entire substrate heat-treating apparatus to have a compact construction.

BRIEF DESCRIPTION OF THE DRAWINGS

For the purpose of illustrating the invention, there are shown in the drawings a form that is presently preferred, it being understood, however, that the invention is not limited to the precise arrangements and instrumentalities shown.

DESCRIPTION OF THE PREFERRED EMBODIMENTS

An embodiment of the present invention will be described hereinafter with reference to the drawings.

Figure 1:
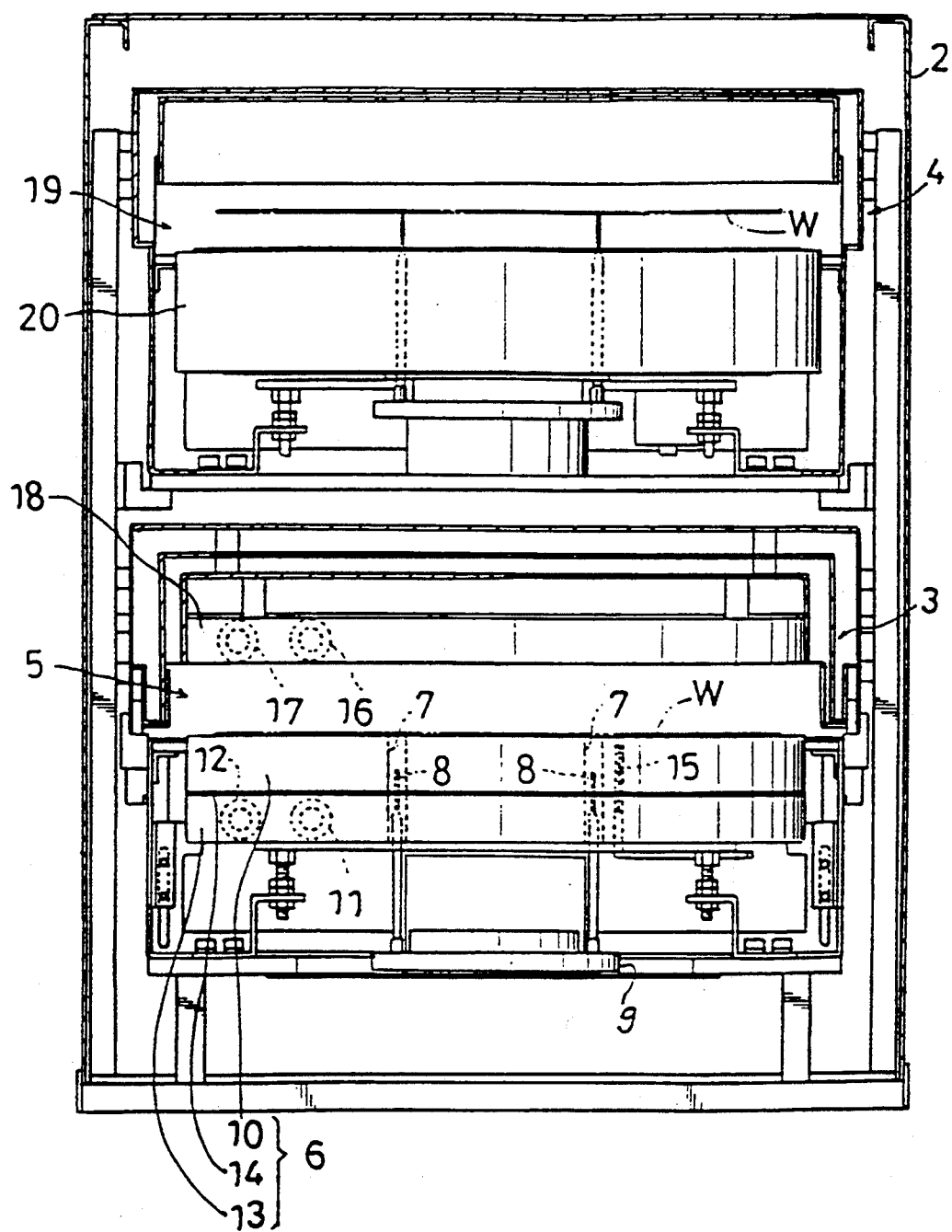
FIG. 1 is an overall view in vertical section of a substrate heat-treating apparatus embodying the present invention.

As seen in FIG. 1, substrate heat-treating apparatus embodying the present invention includes a casing 2 having a substrate cooling device 3 mounted in a lower portion thereof, and a substrate heating device 4 mounted in an upper portion.

The substrate cooling device 3 includes a treating chamber 5 housing a cooling plate assembly 6 defining perforations 7 for vertically movably receiving substrate support pins 8. When the support pins 8 are raised, a substrate or wafer W is placed on or removed from the support pins 8 by a substrate transport robot (not shown). The wafer W is moved to a position resting on the cooling plate assembly 6 by lowering the support pins 8. Though not shown, the substrate support pins 8 are rigidly connected to a support member 9 operatively connected to an air cylinder extendible and contractible to vertically move the support pins 8.

Figure 2:
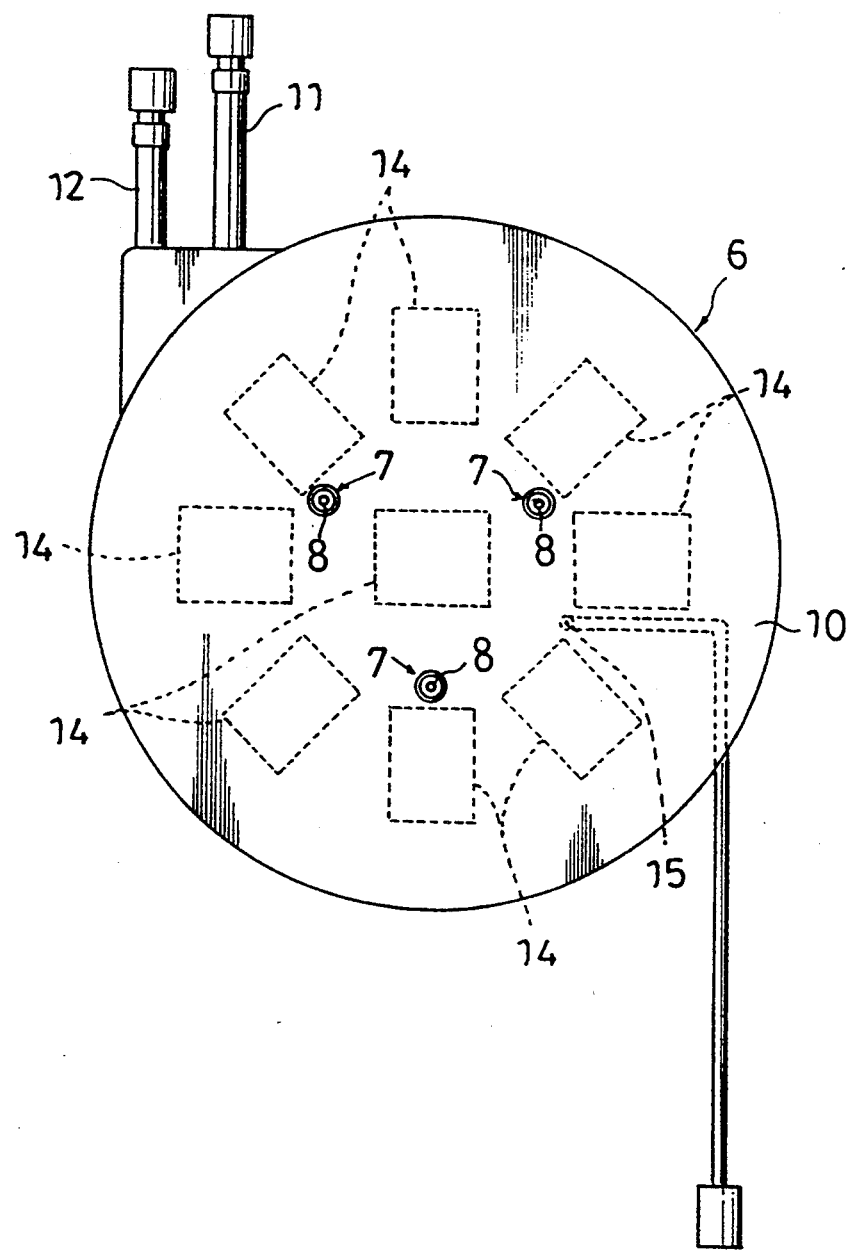
FIG. 2 is a plan view of a principal portion of a substrate cooling device.

The cooling plate assembly 6 includes an aluminum heat conduction plate 10 for supporting the wafer W, an aluminum water-cooled plate 13, and a quick cooling Peltier element 14 interposed between the heat conduction plate 10 and water-cooled plate 13. As shown in plan view of FIG. 2, a first water supply pipe 11 and a first water drain pipe 12 are connected to the water-cooled plate 13. Numeral 15 in the drawings denotes a temperature detecting resistor embedded in the heat conduction plate 10 for measuring a temperature thereof.

The treating chamber 5 further houses an aluminum, water-cooled, auxiliary cooling plate 18 disposed on or adjacent the ceiling and having a second water supply pipe 16 and a second water drain pipe 17 connected thereto. The auxiliary cooling plate 18 cools the atmospheric temperature in the treating chamber 5 above the wafer W placed on the cooling plate assembly 6, to the same temperature as a target temperature (e.g. 20° C.) to which the wafer W is to be cooled by the cooling plate assembly 6.

The substrate heating device 4 includes a treating chamber 19 housing a heating plate assembly 20 having a heater such as a plate heater. As in the substrate cooling device 3, a wafer W is transported in and out, using vertically movable substrate support pins and a robot. The wafer W brought into the heating device 4 is placed on the heating plate assembly 20 and heated to a high treating temperature (e.g. 150° C).

With the above construction, the wafer W treated at the high temperature in the substrate heating device 4 is cooled in the substrate cooling device 3 to a target temperature such as room temperature. At this time, the atmospheric temperature in the treating chamber 5 is cooled to the target temperature by the auxiliary cooling plate 18. The wafer W is cooled quickly by the cooling plate assembly 6 without producing a temperature gradient with the atmospheric temperature and without heat supply from the ambient. After this cooling step, the wafer W has a surface temperature distribution with improved uniformity.

Test results will be described next.

Three cooling plate assemblies were prepared and each used in the above apparatus. Measurement was carried out in the following way. This is done taking variations in characteristics among the sampled cooling plate assemblies into account.

Monocrystal silicon semiconductor wafers of 8-inch diameter were used as wafers W. The target temperature to which the wafers W were to be cooled was set to 20° C., and each cooling plate assembly 6 for supporting wafers W was controlled to the same temperature, 20° C. The interior of treating chamber 5 was maintained at a constant temperature T by supplying cooling water to the auxiliary cooling plate 18. Under these conditions, temperature distribution ranges of the wafers W were measured as set out below. This test was repeated with the constant temperature T set to a plurality of values from about 15° C. to about 30° C.

Figure 3:
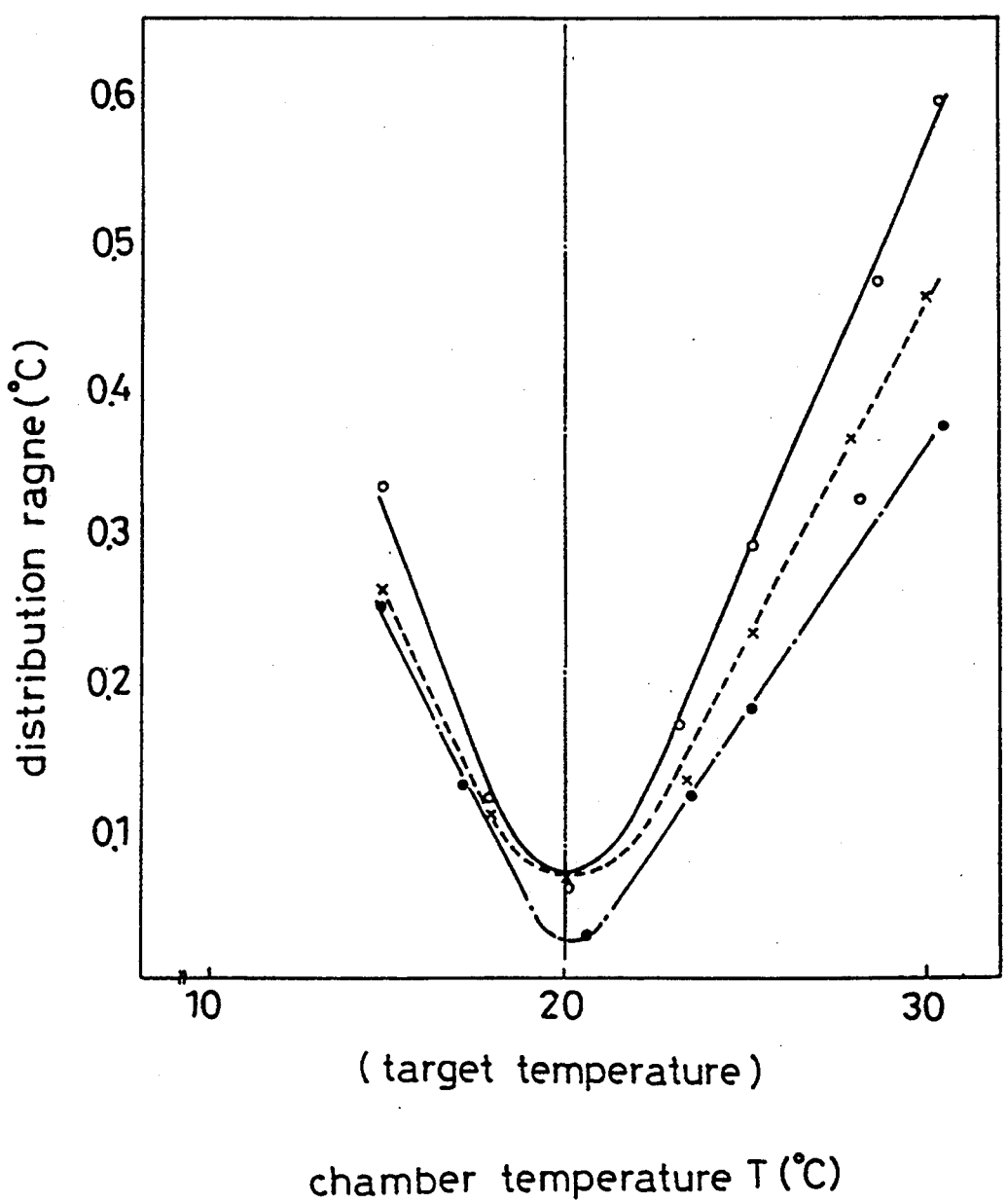
FIG. 3 is a graph showing uniformity of surface temperature distribution.

The temperature distribution range for each constant temperature T was measured in a total of 9 positions including the center of each wafer W and positions at 45° intervals along a virtual circle of 90 mm radius around the center. A difference between maximum temperature and minimum temperature was obtained as the temperature distribution range. FIG. 3 is a graph showing the results plotted with the temperature distribution range represented by the vertical axis, and the interior temperature of treating chamber 5 by the horizontal axis.

The results clearly show that, whichever cooling plate assembly is used, the closer the atmospheric temperature T is to the cooling plate temperature, the smaller the temperature distribution becomes, to improve uniformity of surface temperature distribution.

In the above embodiment, the cooling plate assembly 6 includes both the water-cooled plate 13 and Peltier element 14. However, the cooling plate assembly 6 may include only one of them, or may include other means such as a refrigerant type cooling member.

In the above embodiment, the auxiliary cooling plate 18 is disposed only on or adjacent the ceiling of the treating chamber 5. In accordance with the present invention, components corresponding to the auxiliary cooling plate 18 may be provided on or adjacent side walls of the treating chamber 5 besides the ceiling.

In the above embodiment, the auxiliary cooling plate 18 has a water cooler with cooling water flowing from the second water supply pipe 16 to the second water drain pipe 17. The auxiliary cooling plate 18 may include a Peltier element instead of the water cooler, or both the water cooler and a Peltier element, or other means such as a refrigerant type cooling member.

In the above embodiment, the wafer W is placed tight on the cooling plate assembly 6 for support. Alternatively, the cooling plate assembly 6 may define a plurality of recesses having a predetermined depth, with ceramic balls fitted therein, the balls having a diameter of several hundred micrometers exceeding the depth of the recesses. In this case, the wafer W is placed on the ceramic balls, so that the wafer W is supported with a slight gap maintained between the cooling plate assembly 6 and wafer W (not shown).

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate cooling device comprising:
   a treating chamber for receiving a substrate;
   cooling plate means for supporting said substrate in said treating chamber; and
   main cooling means for cooling said substrate supported on said cooling plate means;
   wherein said treating chamber comprises auxiliary cooling means disposed above said substrate supported on said cooling plate means for cooling said substrate.

2. A substrate cooling device as defined in claim 1, wherein said auxiliary cooling means is operable to reduce an atmospheric temperature in a space above said substrate supported on said cooling plate means to a target temperature to which said substrate is to be cooled by said cooling plate means.

3. A substrate cooling device as defined in claim 1, wherein said main cooling means comprises a Peltier element.

4. A substrate cooling device as defined in claim 1, wherein said cooling plate means is constructed to support said substrate in tight contact therewith.

5. A substrate cooling device as defined in claim 1, wherein said cooling plate means is constructed to support said substrate with a slight gap maintained therebetween.

6. A substrate cooling device as defined in claim 1, wherein said auxiliary cooling means comprises a water-cooled auxiliary cooling plate having a lower surface thereof opposed to said substrate supported on said cooling plate means.

7. A substrate cooling device comprising:
   a treating chamber for receiving a substrate;
   cooling plate means for supporting said substrate in said treating chamber; and
   main cooling means for cooling said substrate supported on said cooling plate means;
   wherein said treating chamber comprises auxiliary cooling means disposed above said cooling plate means for cooling said substrate.

8. A substrate cooling device as defined in claim 7, wherein said cooling means are cooled to a temperature corresponding to a target temperature to which said substrate is to be cooled.

* * * * *